United States Patent
Hosotani et al.

[11] Patent Number: 5,828,618
[45] Date of Patent: Oct. 27, 1998

[54] LINE MEMORY

[75] Inventors: Shiro Hosotani; Minobu Yazawa, both of Tokyo, Japan

[73] Assignee: Mitsubishi Denki Kabushiki Kaisha, Tokyo, Japan

[21] Appl. No.: 895,908

[22] Filed: Jul. 17, 1997

[30] Foreign Application Priority Data

Mar. 10, 1997 [JP] Japan .................................... 9-055016

[51] Int. Cl.$^6$ ...................................................... G11C 7/00
[52] U.S. Cl. .................... 365/221; 365/219; 365/189.01; 365/189.04
[58] Field of Search ............................... 365/189.01, 219, 365/221, 189.04, 230.05

[56] References Cited

U.S. PATENT DOCUMENTS

| | | | |
|---|---|---|---|
| 5,508,967 | 4/1996 | Karino | 365/219 |
| 5,596,540 | 1/1997 | Diem et al. | 365/221 |
| 5,646,903 | 7/1997 | Johnson | 365/221 X |

FOREIGN PATENT DOCUMENTS 62-200591  9/1987  Japan .

OTHER PUBLICATIONS

M. Kimura et al., "A 3V, 100 MHZ, 35mW, Dynamic Line Memory Macro Cell for HDTV Applications," Reprinted from Proceedings of the IEEE 1992 Custom Integrated Circuits Conference, Boston, MA, May 3–6, 1992, pp. 7.4.1–7.4.4.

*Primary Examiner*—Huan Hoang
*Attorney, Agent, or Firm*—Burns, Doane, Swecker & Mathis, LLP

[57] ABSTRACT

The function of a line memory can be achieved only with one bit line. As word lines $WL_{j-1}$ and $WL_j$ are activated in this order, data has already been read out before new data is written into memory cells $MC_{j-1,i}$ and $MC_{j,1}$. More specifically, a writing process is performed on the same memory cell after a readout process, achieving delay operation as taught in a conventional technique. Further, as both operations of a tristate buffer 11 and a D latch 13 are controlled in accordance with the readout and the writing processes, one bit line serves both as a write bit line and a read bit line.

15 Claims, 6 Drawing Sheets ated with the clock, accompanied with precharge
LINE MEMORY

BACKGROUND OF THE INVENTION

1. Field of the Invention

This invention is related to a line memory, particularly to the structure of a memory cell.

2. Description of the Background Art

A line memory has been used as a delay element in video signal processing such as that for delaying one scanning line. A reference "A 3V, 100 MHz, 35 mW, Dynamic Line Memory Macro Cell for HDTV Application" (CICC Digest of Tech, Papers, p.7.4.1, 1992) by Masatoshi KIMURA et al. shows a typical example.

FIG. 5 is a circuit diagram roughly showing the line memory described in the above-mentioned reference. Data sequentially inputted into the line memory is first inputted into a serial-to-parallel conversion circuit 2 in which the data is converted into m parallel data, for example, into eight. These m parallel data may consist of a plurality of bits, respectively, for each of which one storage surface with memory cells arranged in a matrix of rows and columns as shown in FIG. 5 may be provided. For simplicity, however, each parallel data is regarded as one bit in the following description.

The line memory is a First In/First Out (FIFO) sequential memory, putting great importance on an address pointer. An address pointer 1 in the line memory is connected to word lines $WL_0$ to $WL_{n-1}$, where n is the number of rows of the memory cells, and alternatively activates the word lines in numerical order ($WL_0$, $WL_1$, $WL_2$ ... in synchronization with a clock (not shown).

Each memory cell MC includes a data input terminal D, a write control terminal W, a data output terminal Q and a read control terminal R. All write control terminals W of the memory cells MC in a certain row, and all read control terminals R of the memory cells MC in another row adjacent to that row are, as a rule, connected to the same word line $WL_j$ (i=0 to n−1). The memory cells MC connected to the word lines $WL_0$ and $WL_{n-1}$, may make an exceptional connection.

All data input terminals D of the memory cells MC in a certain column are connected to the same write bit line $WBL_i$ (i=0 to m−1), and all data output terminals Q of the memory cells in a certain column are connected to the same read bit line $RBL_i$.

Eight parallel data are sent to the write bit lines $WBL_0$ to $WBL_7$ to be written to the memory cell MC including the write control terminal W connected to an active word line. At the same time, the active word line operates readout of data from the memory cell MC including the read control terminal R connected is thereto.

The readout is performed in two steps. In the first step, the read bit lines $RBL_0$ to $RBL_7$ are all precharged to a desirable level (for example, VDD>0) by a precharge circuit 3. In the second step, activation of the word line $WL_j$ leads readout, and, in accordance with data stored in the memory cell MC, the read bit line $RBL_j$ changes its level between "H" and "L". This change is amplified by a sense amplifier 4 and is outputted through a parallel-to-serial conversion circuit 5 as serial data.

FIG. 6 is a circuit diagram illustrating the structure of conventional memory cells. The memory cells $MC_{j-1,i}$ and $MC_{j,i}$ have the same structure. A word line $WL_j$ first becomes "H" and active, and a write transistor Qc of the memory cell $MC_{j,i}$ turns on. If storage capacity Cs of the memory cell $MC_{j,i}$ is charged to a prescribed voltage (or the memory cell $MC_{j,i}$ is written to the level "H"), a read transistor Qr is in the ON state. Thus, charge precharged to the read bit line $RBL_i$ is discharged via the transistors Qc, Qr, and the read bit line $RBL_i$ becomes "L".

While such readout from the memory cell $MC_{j,i}$ is performed, a write transistor Qw of the memory cell $MC_{j-1,i}$ turns on. Then, data given to a write bit line $WBL_i$ is sent through the write transistor Qw to the storage capacity Cs of the memory cell $MC_{j-1,i}$.

As described above, sequential activation of the word line in accordance with the clock, accompanied with precharge of the read bit line $RBL_i$; detection of data provided for the read bit line $RBL_i$ by the sense amplifier; and updating of data to be sent to the write bit line $WBL_i$, makes it possible simultaneously to sequentially update data along the activation and to readout data before updating.

Normally, the address pointer is set at an initial address by reset input from outside, and then increases an address to be accessed (position of a word line to be activated) in accordance with a clock. Thus, if the reset input from outside is made in a prescribed period, for example, in a period of one scanning line in video signal processing, as long as the number of rows in which the memory cells are arranged is more than that corresponding to this scanning time, data exactly before one scanning line can be read out, easily delaying one scanning line.

The conventional line memory, however, needs both the write bit line $WBL_i$ and the read bit line $RBL_i$. Having large influence on the area of the line memory with its size, a memory cell which requires two bit lines has been an important subject to be solved for reducing the area of the line memory.

SUMMARY OF THE INVENTION

The present invention is directed to a line memory. The line memory comprises: a plurality of memory cells arranged in at least one column, each including a data input terminal, a write control terminal, a data output terminal, and a read control terminal; word lines commonly connected to the write control terminal of one of the plurality of memory cells, and the read control terminal of another of the plurality of memory cells, those memory cells being adjacent to each other; a tristate buffer provided in each of the column, having an input end for receiving an input data to be inputted into the line memory, and an output end; a bit line provided in each of the column and connected to the output end of the tristate buffer, the data input terminal and the data output terminal; and a latch circuit including an input end connected to the bit line, and an output end.

Preferably, according to a second aspect of the present invention, the word lines are sequentially activated from one of the plurality of memory cells to another.

Preferably, according to a third aspect of the present invention, the column consists of a plurality of columns.

Preferably, according to a fourth aspect of the present invention, the line memory further comprises: a sense amplifier inputting an output from the output end of the latch circuit.

Preferably, according to a fifth aspect of the present invention, the input data is converted from serial to parallel and is provided in each of the columns.

Preferably, according to a sixth aspect of the present invention, the line memory further comprises: a parallel-to-serial conversion circuit for converting the output of the sense amplifier from parallel to serial and outputting the result.

Preferably, according to a seventh aspect of the present invention, the line memory further comprises: a buffer provided between the bit line and the input end of the latch circuit.

Preferably, according to an eighth aspect of the present invention, both operations of the latch circuit and the tristate buffer are controlled by the same control signal; the tristate buffer makes the output end of itself high-impedance when the control signal takes a first value, while buffering the input data of itself when the control signal takes a second value; and the latch circuit latches data stored in the input end by transition of the control signal from the first value to the second value.

Preferably, according to a ninth aspect of the present invention, the word lines are activated at least before and after the transition.

Preferably, according to a tenth aspect of the present invention, the bit line is precharged in a predetermined period before the transition, and the word lines are activated in the predetermined period.

Preferably, according to an eleventh aspect of the present invention, each of the plurality of memory cells includes: a write transistor with a gate connected to the write control terminal; a first read transistor with a gate connected to the read control terminal; storage capacity; and a second read transistor with a gate connected to one end of the storage capacity, connected in series to the first read transistor and the write transistor between both ends of the storage capacity, wherein the same source/drain region is commonly used by: the write transistor of a first of the plurality of memory cells, having the gate connected to a first of the word lines; the first read transistor of a second of the plurality of memory cells, having the gate connected to the first of the word lines; the write transistor of the second of the plurality of memory cells, having the gate connected to a second of the word lines adjacent to the first of the word lines; and the first read transistor of a third of the plurality of memory cells, having the gate connected to the second of the word lines.

Preferably, according to a twelfth aspect of the present invention, the upper portion of the same source/drain region is surrounded from all directions by: the gate in the write transistor of the first of the plurality of memory cells; the gate in the first read transistor of the second of the plurality of memory cells; the gate in the write transistor of the second of the plurality of memory cells; and the gate in the first read transistor of the third of the plurality of memory cells.

Preferably, according to a thirteenth aspect of the present invention, the storage capacity is determined by parasitic capacitance to the gate of the second read transistor.

In accordance with the line memory of the first aspect, one memory cell, out of two memory cells both of which are connected to the active word line, becomes readable while the other becomes writable. Thus, as to the bit line provided according to those memory cells, data stored in one of the memory cells is secured by previously driving the latch circuit with the output end of the tristate buffer in the state of high impedance, and new data is also written into the other memory cell by providing an input data from the output end of the tristate buffer to the bit line.

In this operation, the data output terminal of one of the memory cells and the data input terminal of the other memory cell are commonly connected via the bit line, to write data stored in the former memory cell affects data stored in the latter memory cell. After that, however, data stored in the former memory cell is newly written, preventing deterioration in the function of the line memory.

In accordance with the line memory of the eighth aspect, the use of the same control signal facilitates control of both operations of the latch circuit and the tristate buffer.

In accordance with the line memory of the tenth aspect, there is no need to avoid a prescribed period for precharge in selective activation of the word lines. This simplifies the structure of a desirable circuit.

In accordance with the line memory of the eleventh aspect, as four transistors use the same source/drain region, the parasitic capacitance of the bit lines is decreased, thereby improving the speed of readout.

The object of this invention is to achieve the function of the line memory only with one bit line.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
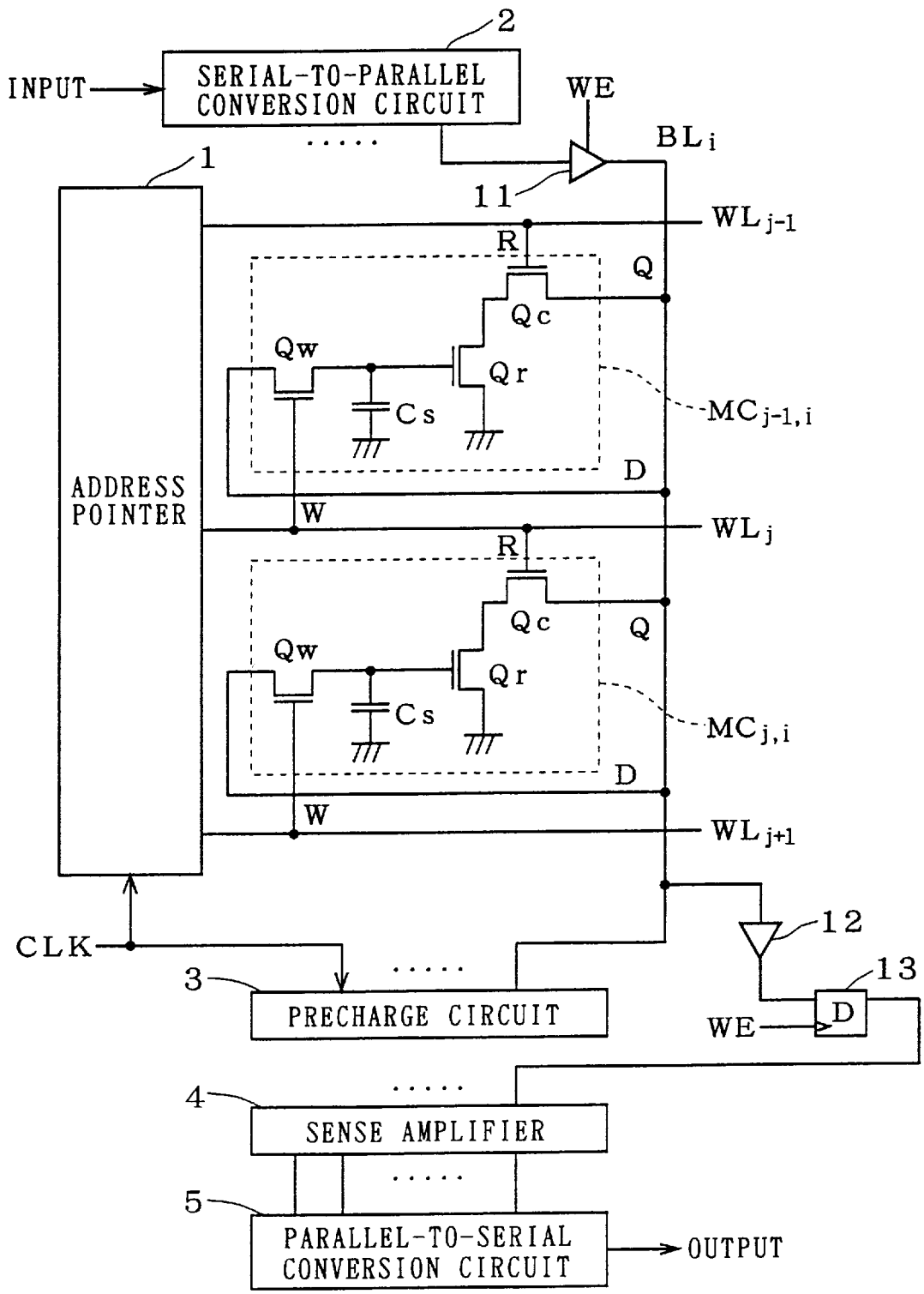
FIG. 1 is a circuit diagram showing the structure of a line memory in accordance with a first preferred embodiment of the present invention.
Figure 5:
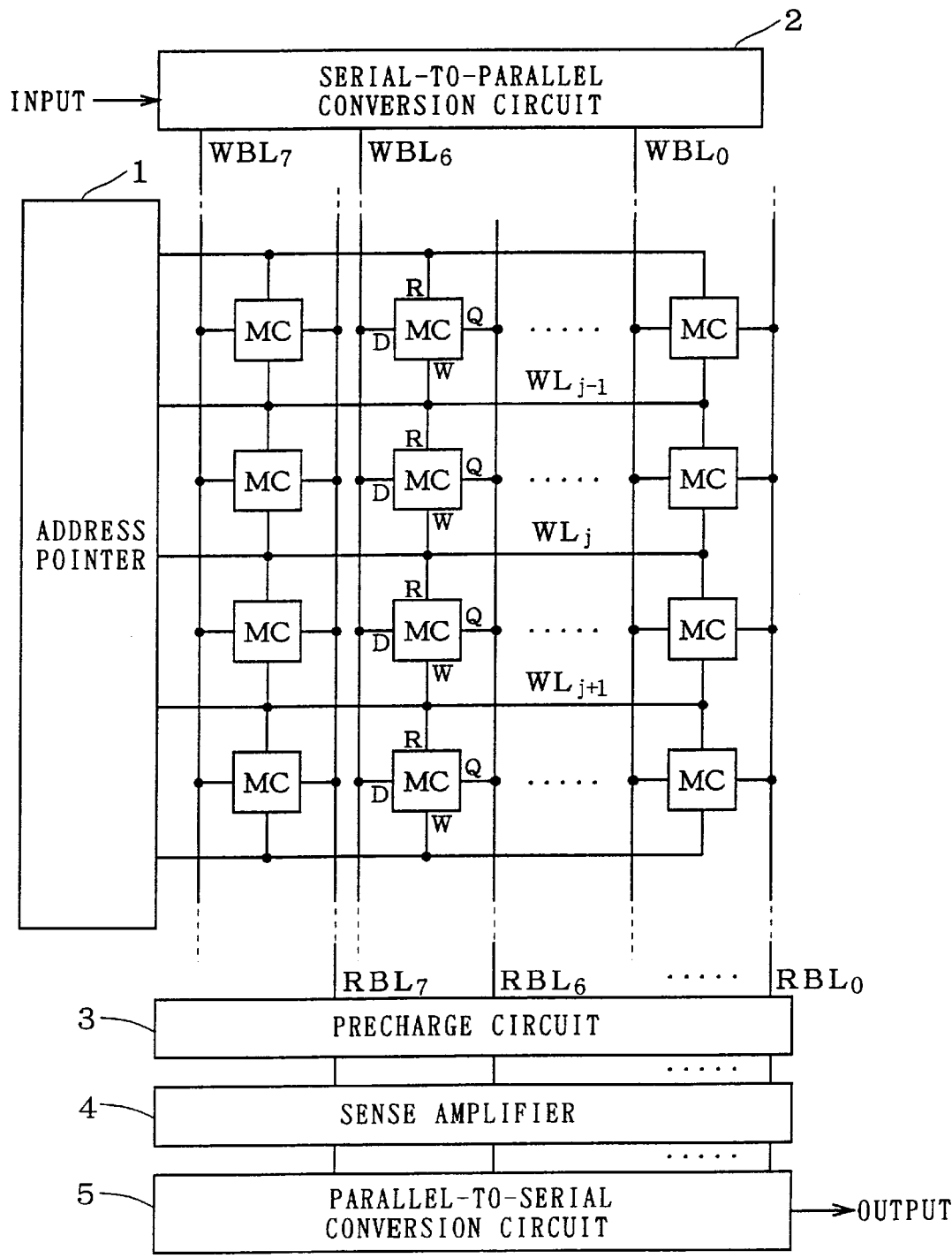
FIG. 5 is a circuit diagram showing the structure of the conventional line memory.
Figure 6:
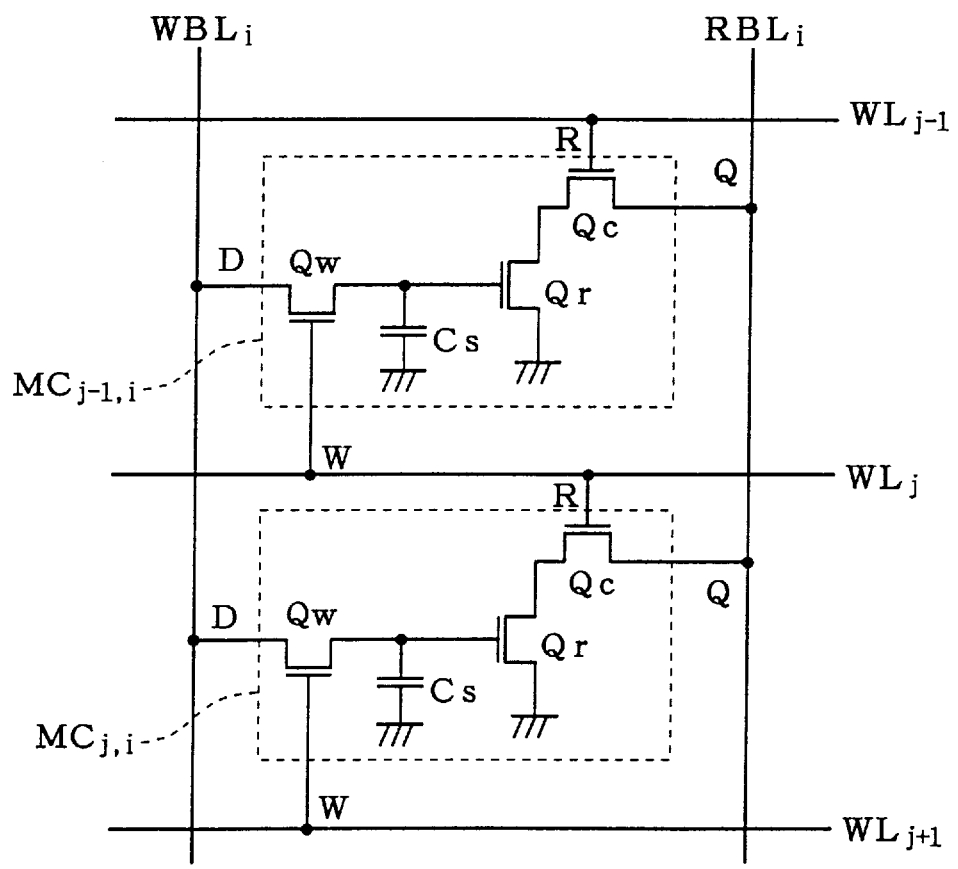
FIG. 6 is a circuit diagram showing the structure of the conventional memory cells.

FIG. 1 is a circuit diagram illustrating the structure of a line memory in accordance with a first preferred embodiment of the present invention. According to the present invention, a plurality of memory cells are arranged in a matrix of rows and columns as well as those shown in FIG. 5. For simplicity, FIG. 1 shows only two memory cells $MC_{j-1,i}$ and $MC_{j,i}$ which are adjacent to each other in the same ith column and are arranged in the (j−1)th and the jth rows, respectively. The detailed structure is also shown in this figure.

An address pointer 1 alternatively activates a plurality of word lines $WL_0$ to $WL_{n-1}$ in numerical order (WL0, WL1, WL2 . . . ) in synchronization with a clock CLK.

Each memory cell $MC_{j-1,i}$ and $MC_{j,i}$ includes a data input terminal D, a write control terminal W, a data output terminal Q and a read control terminal R. The read control terminal R and the write control terminal W, both of the memory cell $MC_{j-1,i}$ are connected to the word lines $WL_{j-1}$, $WL_j$, respectively, and the read control terminal R and the write control terminal W, both of the memory cell $MC_{j,i}$, are connected to the word lines $WL_j$, $WL_{j+1}$, respectively.

Both of the data input terminals D and the data output terminals Q of the memory cells $MC_{j-1,i}$ and $MC_{j,i}$ are, different from the conventional line memory, connected to a bit line $BL_i$. The bit line $BL_i$ serves both as the write bit line $WBL_i$ and the read bit line $RBL_i$ of the conventional line memory by a control method, which will be described in detail later.

Data sequentially inputted into the line memory is first inputted into a serial-to-parallel conversion circuit 2. Though FIG. 1 only shows one of signals in the parallel form (hereinafter referred to as a "parallel component signal") for simplicity, the serial-to-parallel conversion circuit 2 is connected to the bit line BL, via a tristate buffer 11 provided according to the number of the parallel component signals (for example, eight, on the basis of the conventional technique). The tristate =buffer 11 is controlled by a write enable signal WE. When the tristate buffer 11 is activated to the level "H", the parallel component signals are sent to the bit line $BL_i$.

The bit line $BL_i$ also connects a precharge circuit 3. The precharge circuit 3 precharges the bit line $BL_i$ to a prescribed potential for a prescribed period in synchronization with the clock CLK.

Further, the bit line $BL_i$ connects, via a buffer 12, a D latch 13, the output of which is sent to a sense amplifier 4. The D latch 13 latches value which is provided for the bit line $BL_i$ in the rise of the write enable signal WE.

Each function of the sense amplifier 4 and the parallel-to-serial conversion circuit 5 is the same as that in the conventional technique, in which data stored in the memory cells arranged in a matrix of rows and columns is sequentially read out and outputted in a serial form.

The memory cells $MC_{j-1,i}$ and $MC_{j,i}$ have the same structure. In each structure, a read transistor Qc, a write transistor Qw and a read transistor Qr are connected in series via the data input terminal D, the data output terminal Q and the bit line $BL_i$ between a ground and one end of storage capacity Cs. The end of the storage capacity Cs is connected to a gate of the read transistor Qr while the other end is grounded. Gates of the read transistor Qc and the write transistor Qw are connected to the read control terminal R and the write control terminal W, respectively.

Figure 2:
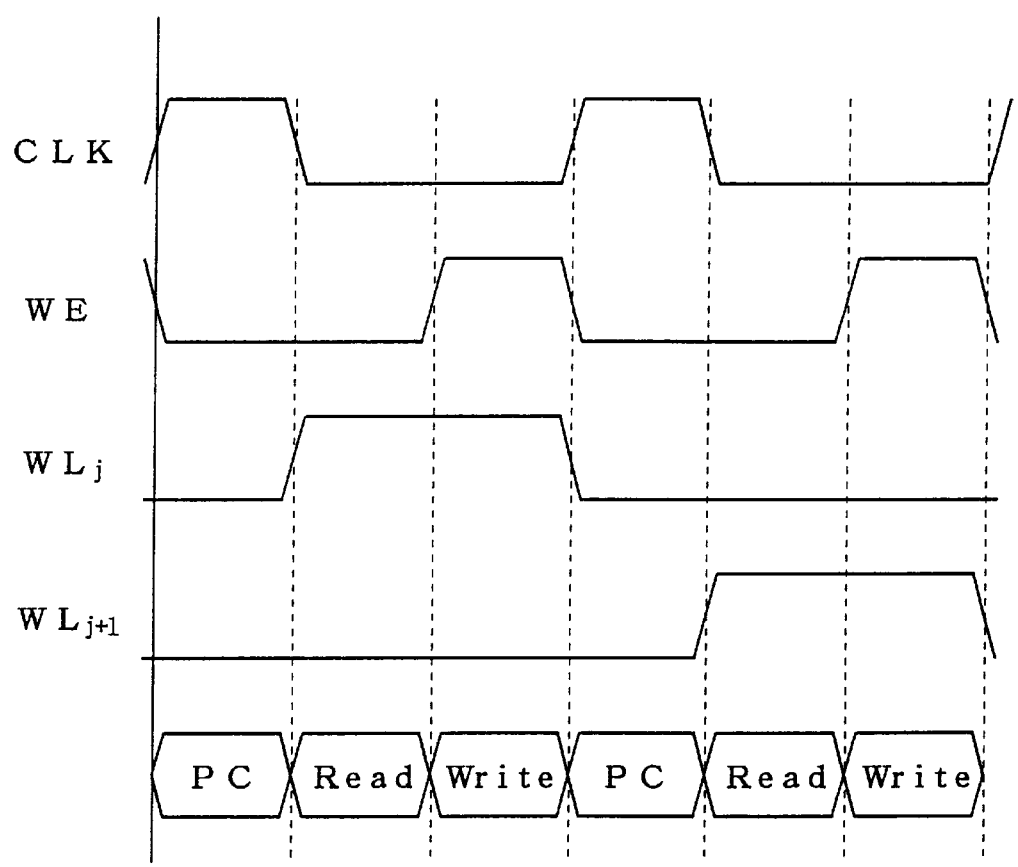
FIG. 2 is a timing chart illustrating operation of the line memory in accordance with the first preferred embodiment of the present invention.

FIG. 2 is a timing chart illustrating operation of the line memory shown in FIG. 1. The line memory operates in three steps in synchronization with the clock CLK. First, with rise of the clock CLK, the precharge circuit 3 starts to precharge all bit lines including the bit line $BL_i$ in a precharge period PC (first step). In the precharge period PC, no word lines are activated.

As soon as the precharge period PC ends, the word line $WL_j$ is activated to the level "H", which is the start of the second step.

After the activation of the word line $WL_j$, the write enable signal WE has been activated until the clock CLK rises next (third step). Thus, the word line $WL_j$ has been activated in the second and the third steps.

The bit line $BL_i$ precharged in the first step is connected to the read transistor Qr via the read transistor Qc of the memory cell $MC_{j,i}$ which includes the read control terminal R connected to the word line $WL_j$ activated in the second step. The read transistor Qr reduces or holds potential of the bit line $BL_i$ according to charge or discharge of the storage capacity Cs connected to the gate of the read transistor Qr. In other words, readout process is performed.

In the second step, the write enable signal WE is inactive, and the tristate buffer 11 is in the state of high impedance, which gives no influence on the bit line $BL_i$. The bit line $BL_i$ is, on the other hand, connected to an input end of the D latch 13 via the buffer 12.

In the third step, when the write enable signal WE rises, the D latch 13 latches value given to its input end. Thus, the value of the bit line $BL_i$ in the second step is stored in the D latch 13, and is transmitted to the sense amplifier 4. On the other hand, the tristate buffer 11 provides a new parallel component signal to the bit line $BL_i$. Since the word line $WL_j$ is kept in the level "H" in the third step, the storage capacity Cs of the memory cell $MC_{j,i}$ including the write control terminal W connected to the word line $WL_j$ is charged or discharged via the write transistor Qw according to the new parallel component signal. In other words, writing process is performed.

As the read transistor Qc of the memory cell $MC_{j,i}$ is in the ON state at this time, voltage applied to the read transistor Qr of the memory cell $MC_{j,i}$ may be different from that in the second step, according to output from the tristate buffer 11 which provides data to be written into the memory cell $MC_{j-1,i}$. This, however, does not cause any problem because the data held in the memory cell $MC_{j,i}$ until the second step has already been stored in the D latch 13. Further, with driving capability of the tristate buffer 11 great enough, even if the read transistor Qc of the memory cell $MC_{j,i}$ is in the ON state, the storage capacity Cs of the memory cell $MC_{j-1,i}$ can be sufficiently charged or discharged.

It can be easily achieved to produce the above write enable signal WE from the clock CLK, and further to define the period, during which the word lines has been activated by the address pointer 1, as the second and the third steps.

As the word lines $WL_{j-1}$ and $WL_j$ are activated in this order as previously described, readout has already been completed when new data is written into the memory cells $MC_{j-1,i}$ and $MC_{j,i}$. In other words, as the writing process is performed on the same memory cell after the readout process ends, delay operation can be easily performed as is done in the conventional technique. Further, as operations of the tristate buffer 11 and the D latch 13 are controlled according to the readout process and the writing process, one bit line serves both as the write bit line and the read bit line.

Though both controlled by the write enable signal WE, the tristate buffer 11 and the D latch 13 may be controlled by different signals, respectively. The effect of the present invention can be obtained only if the D latch 13 first operates and the tristate buffer 11 subsequently turns on in a period except the precharge period PC. It is, however, obvious that the use of the same write enable signal WE simplifies the structure of the line memory, as described in this preferred embodiment.

Second Preferred Embodiment

Figure 3:
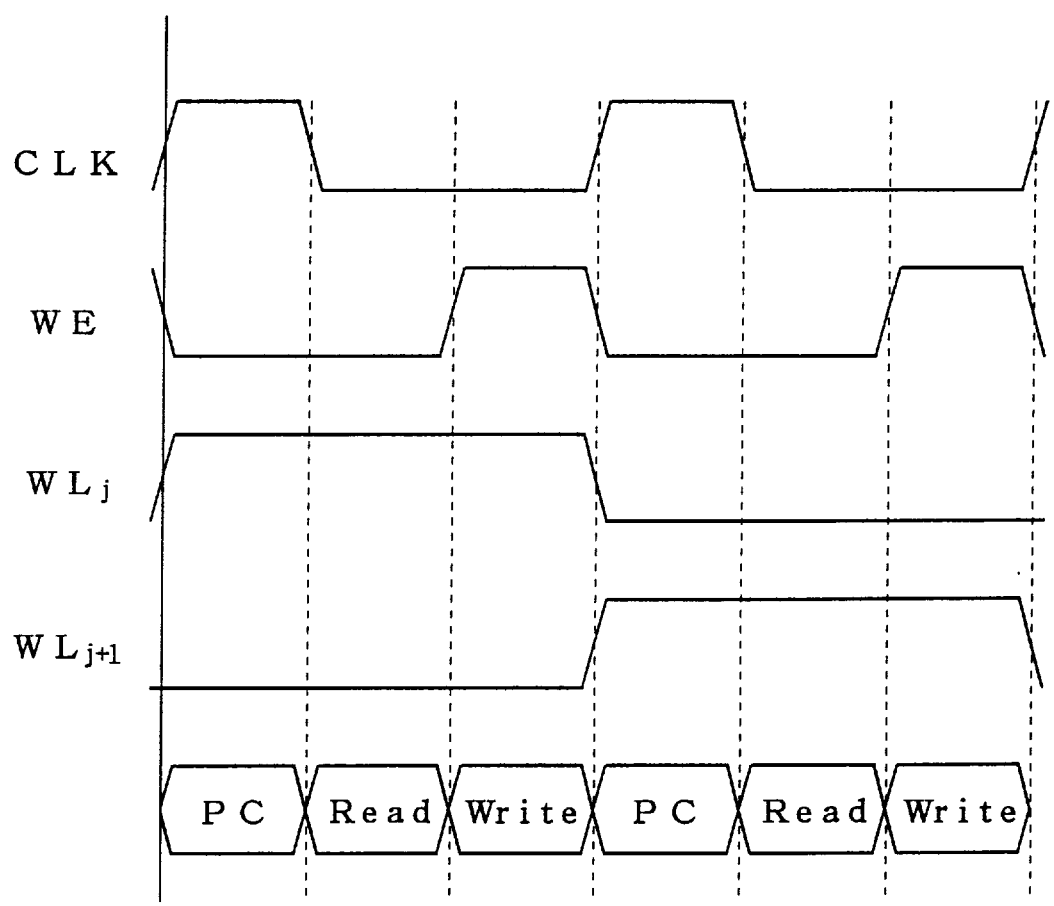
FIG. 3 is a timing chart illustrating operation of a line memory in accordance with a second preferred embodiment of the present invention.

FIG. 3 is a timing chart illustrating operation of a line memory in accordance with the second preferred embodiment of the present invention. This can be applied to the structure of the line memory shown in FIG. 1. In the first preferred embodiment, the word line is active only in periods except the precharge period PC, that is, in the second and the third steps. According to this second preferred embodiment, however, the word line is active in the first step or the precharged period PC as well.

According to the second preferred embodiment, a transistor at an output stage of the precharge circuit 3 and the read transistor Qc of the memory cell simultaneously turn on in the first step. With driving capability of the transistor at the output stage of the precharge circuit 3 great enough, however, the bit line BL, can be sufficiently precharged and the read transistor Qc in the ON state would not affect voltage applied to the storage capacity Cs. Thus, there is no influence on operation.

Compared to the first preferred embodiment, the second preferred embodiment has the advantage of simplifying the structure of a circuit required for the address appointee 1 to select the word lines.

Third Preferred Embodiment

Figure 4:
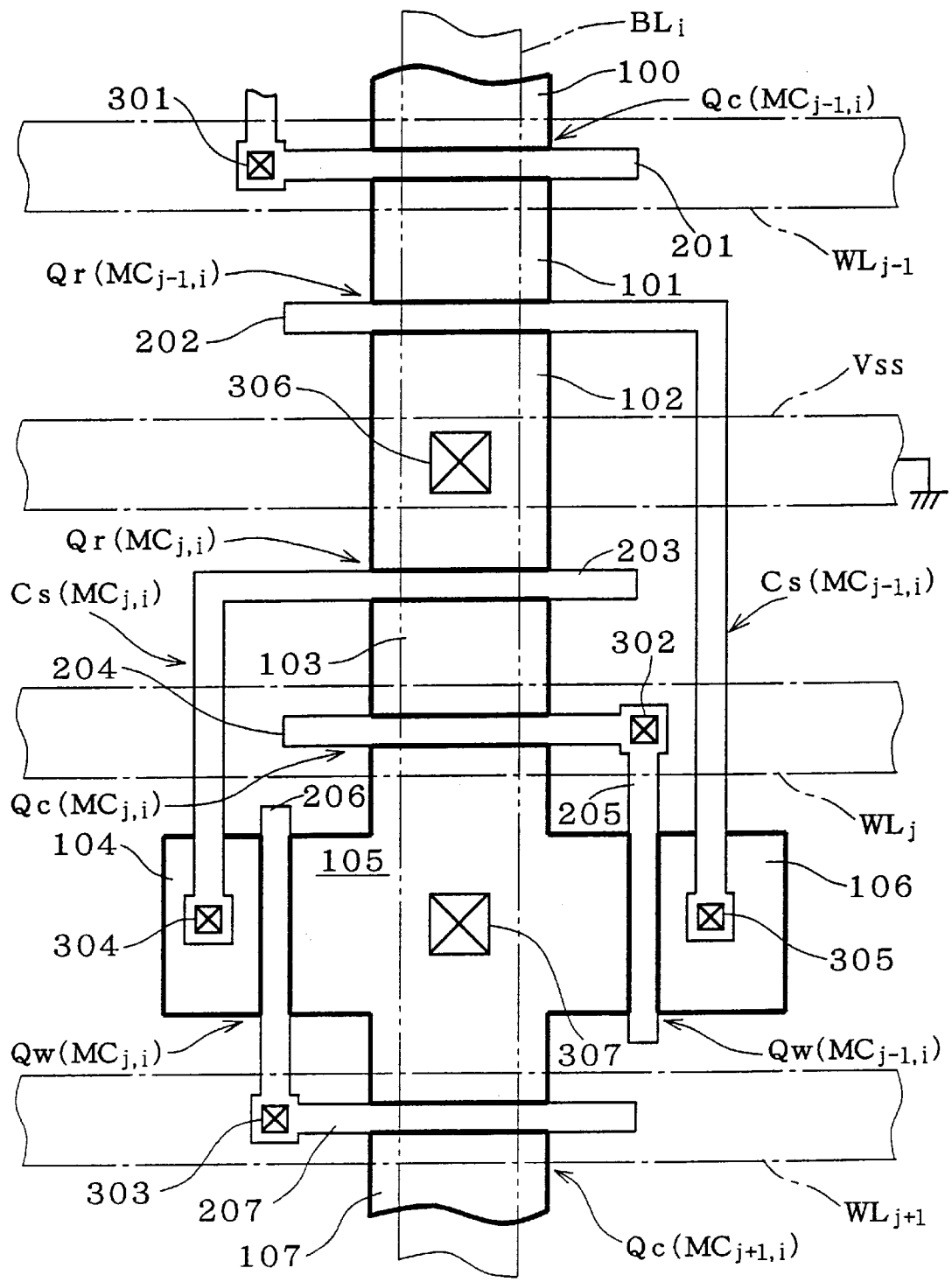
FIG. 4 is a plan view showing the structure of memory cells in a line memory in accordance with a third preferred embodiment of the present invention.

FIG. 4 is a plan view showing a memory cell in accordance with a third preferred embodiment of the present invention. This figure shows the structure of the memory cells $MC_{j-1,i}$ and $MC_{j,i}$ shown in FIG. 1, and a part of the structure of a memory cell $MC_{j+1,i}$ which is not shown in FIG. 1.

In FIG. 4, the thick solid line, the usual solid line, the one-dot chained line and the two-dot chained line indicate source/drain regions 100 to 107, gates 201 to 207 which consist of a MOS transistor with the source/drain regions, word lines $WL_{j-1}$, $WL_j$, $WL_{j+1}$, and a bit line $BL_i$, respectively. These are arranged in the vertical direction in this order.

Contact holes 301 to 307 connect the word line $WL_{j-1}$ and the gate 201; the word line $WL_j$ and the gates 204, 205; the word line $WL_{j+1}$ and the gates 206, 207; the source/drain region 104 and the gate 203; the source drain region 106 and the gate 202; a ground line Vss and the source/drain region 102; and the source/drain region 105 and the bit line $BL_i$, respectively.

The read transistor Qc of the memory cell $MC_{j-1,i}$ consists of the source/drain regions 100, 101 and the gate 201; the read transistor Qr of the memory cell $MC_{j-1,i}$ consists of the source/drain regions 101, 102 and the gate 202; the read transistor Qr of the memory cell $MC_{j,i}$ consists of the source/drain regions 102, 103 and the gate 203; the read transistor Qc of the memory cell $MC_{j,i}$ consists of the source/drain regions 103, 105 and the gate 204; the write transistor Qw of the memory cell $MC_{j-1,i}$ consists of the source drain regions 105, 106 and the gate 205; the write transistor Qw of the memory cell $MC_{j,i}$ consists of the source/drain regions 104, 105 and the gate 206; and the read transistor Qc of the memory cell $MC_{j+1,i}$ consists of the source/drain regions 105, 107 and the gate 207. The storage capacity Cs of both memory cells $MC_{j-1,i}$ and $MC_{j,i}$ is achieved by parasitic capacitance to wires integrally formed with the gates 202, 203, respectively.

In this figure, when the word line $WL_j$ is activated, data stored in the storage capacity Cs of the memory cell $MC_{j,i}$ is read out and new data is written into the storage capacity Cs of the memory cell $MC_{j-1,i}$. When the word line $WL_{j+1}$ is activated, data stored in the memory cell $MC_{j+1,i}$ is read out via the read transistor Qc of the memory cell $MC_{j+1,i}$ and new data is written into the storage capacity Cs of the memory cell $MC_{j,i}$. Thus, the line memory according to the third preferred embodiment operates in the same way as those in the first and the second preferred embodiments, thereby bringing about the same advantage.

Moreover, the upper portion of the source/drain region 105 is surrounded from all directions by four gates 204 to 207 which region is included in four MOS transistors in common. More specifically, as four transistors use the same source/drain region, the parasitic capacitance of the bit line $BL_i$ is reduced, thereby improving the speed of readout.

While the invention has been described in detail, the foregoing description is in all aspects illustrative and not restrictive. It is understood that numerous other modifications and variations can be devised without departing from the scope of the invention.

We claim:

1. A line memory comprising:

a plurality of memory cells arranged in at least one column, each including a data input terminal, a write control terminal, a data output terminal, and a read control terminal;

word lines each commonly connected to said write control terminal of one of said plurality of memory cells, and said read control terminal of another of said plurality of memory cells, those memory cells being adjacent to each other;

a tristate buffer provided in each of said column, having an input end for receiving an input data to be inputted into said line memory, and an output end;

a bit line provided in each of said column and connected to the output end of said tristate buffer, said data input terminal and said data output terminal; and a latch circuit including an input end connected to said bit line, and an output end, latching in a period exclusive to a period when said output end of said tristate buffer is in a state of high impedance.

2. The line memory of claim 1, wherein said word lines are sequentially activated from one word line connected to said read control terminal of one of said plurality of memory cells to another word line connected to said write control terminal of said one of said plurality of memory cells.

3. The line memory of claim 1, wherein said column consists of a plurality of columns.

4. The line memory of claim 3, comprising:

a sense amplifier inputting an output from the output end of said latch circuit.

5. The line memory of claim 4, wherein said input data is converted from serial to parallel and is provided in each said columns.

6. The line memory of claim 5, further comprising:

a parallel-to-serial conversion circuit for converting the output of said sense amplifier from parallel to serial and outputting the result.

7. The line memory of claim 1, further comprising:

a buffer provided between said bit line and the input end of said latch circuit.

8. The line memory of claim 1, wherein:

both operations of said latch circuit and said tristate buffer are controlled by the same control signal;

said tristate buffer makes said output end of itself high-impedance when said control signal takes a first value, while buffering said input data when said control signal takes a second value; and said latch circuit latches data stored in said input end of itself by transition of said control signal from said first value to said second value.

9. The line memory of claim 8, wherein said word lines are activated at least before and after said transition.

10. The line memory of claim 8, wherein said bit line is precharged in a predetermined period before said transition, and said word lines are activated in said predetermined period.

11. The line memory of claim 1, each of said plurality of memory cells including:

a write transistor with a gate connected to said write control terminal;

a first read transistor with a gate connected to said read control terminal;

a storage node connected to one end of said write transistor; and a second read transistor with a gate connected to one end of said storage node, and one end connected to one end of said first read transistor, wherein the same source/drain region is commonly used by: said write transistor of a first of said plurality of memory cells, having said gate connected to a first of said id word lines; said first read transistor of a second of said plurality of memory cells, having said gate connected to said first of said word lines; said write transistor of said second of said plurality of memory cells, having said gate connected to a second of said word lines adjacent to said first of said word lines; and said first read transistor of a third of said plurality of memory cells, having said gate connected to said second of said word lines.

12. The line memory of claim 11, wherein the upper portion of said same source/drain region is surrounded from four directions by:

said gate in said write transistor of said first of said plurality of memory cells;

said gate in said first read transistor of said second of said plurality of memory cells;

said gate in said write transistor of said second of said plurality of memory cells; and said gate in said first read transistor of said third of said plurality of memory cells.

13. The line memory of claim 12, wherein data are stored in parasitic capacitance to said gate of said second read transistor.

14. A line memory comprising:

a plurality of memory cells arranged in at least one column, each including a data input terminal, a write control terminal, a data output terminal, and a read control terminal;

word lines each commonly connected to said write control terminal of one of said plurality of memory cells, and said read control terminal of another of said plurality of memory cells, those memory cells being adjacent to each other; and a bit line provided in each of said column connected to said data input terminal and said data output terminal of each of said plurality of memory cells;

each of said plurality of memory cells including,
a write transistor with a gate connected to said write control terminal,
a read transistor with a gate connected to said read control terminal,
wherein, a portion of the same source/drain region is surrounded from four directions by said gate in said write transistor of a first of said plurality of memory cells, said gate in a read transistor of a second of said plurality of memory cells, said gate in said write transistor of said second of said plurality of memory cells, and said gate in said read transistor of a third of said plurality of memory cells.

15. The line memory of claim 14, wherein the four transistors use the same source/drain region reducing the parasitic capacitance of said bit line and increasing said plurality of memory cells readout speed.

* * * * *